US008115485B1

(12) United States Patent
Maier et al.

(10) Patent No.: US 8,115,485 B1
(45) Date of Patent: Feb. 14, 2012

(54) METHOD AND APPARATUS FOR INTERACTIVELY SETTING PARAMETERS OF AN MR IMAGING SEQUENCE THROUGH INSPECTION OF FREQUENCY SPECTRUM

(75) Inventors: Joseph K. Maier, Milwaukee, WI (US); Hari Hariharan, Pewaukee, WI (US)

(73) Assignee: General Electric Company, Schenectady, NY (US)

( * ) Notice: Subject to any disclaimer, the term of this patent is extended or adjusted under 35 U.S.C. 154(b) by 1741 days.

(21) Appl. No.: 11/276,714

(22) Filed: Mar. 10, 2006

(51) Int. Cl.
*G01V 3/00* (2006.01)
(52) U.S. Cl. ......... 324/318; 324/307; 324/309; 600/410
(58) Field of Classification Search .......... 600/407–428; 324/300–322
See application file for complete search history.

(56) References Cited

U.S. PATENT DOCUMENTS

| | | | | |
|---|---|---|---|---|
| 5,089,784 A * | 2/1992 | Yoshitome et al. | ........... | 324/309 |
| 5,378,985 A * | 1/1995 | Hinks | ........... | 324/309 |
| 5,537,039 A * | 7/1996 | Le Roux et al. | ........... | 324/309 |
| 6,369,568 B1 * | 4/2002 | Ma et al. | ........... | 324/309 |
| 6,570,383 B1 * | 5/2003 | McKinnon et al. | ........... | 324/314 |
| 6,583,623 B1 * | 6/2003 | Kwok et al. | ........... | 324/307 |
| 6,906,515 B2 * | 6/2005 | Yatsui et al. | ........... | 324/309 |
| 6,958,605 B2 * | 10/2005 | Dale et al. | ........... | 324/307 |
| 7,233,818 B1 * | 6/2007 | Aletras et al. | ........... | 600/410 |
| 7,298,146 B1 * | 11/2007 | Maier et al. | ........... | 324/318 |
| 7,355,404 B1 * | 4/2008 | Hariharan et al. | ........... | 324/307 |
| 7,423,430 B1 * | 9/2008 | Sharif et al. | ........... | 324/309 |
| 7,808,239 B2 * | 10/2010 | Miyazaki | ........... | 324/309 |
| 7,928,729 B2 * | 4/2011 | Hargreaves et al. | ........... | 324/309 |
| 7,945,305 B2 * | 5/2011 | Aggarwal et al. | ........... | 600/413 |
| 2006/0224062 A1 * | 10/2006 | Aggarwal et al. | ........... | 600/413 |

* cited by examiner

*Primary Examiner* — Sanjay Cattungal
(74) *Attorney, Agent, or Firm* — Ziolkowski Patent Solutions Group, SC

(57) ABSTRACT

A method of calibrating an imaging sequence includes the application of a pre-scan pulse sequence to acquire MR signals from a region-of-interest to be imaged with an imaging pulse sequence. The pre-scan pulse sequence is interrupted to acquire pre-scan data in a low bandwidth acquisition window. A frequency spectrum is generated from the pre-scan data and displayed to interactively allow a user to establish scan parameters for the imaging pulse sequence.

31 Claims, 4 Drawing Sheets

METHOD AND APPARATUS FOR INTERACTIVELY SETTING PARAMETERS OF AN MR IMAGING SEQUENCE THROUGH INSPECTION OF FREQUENCY SPECTRUM

BACKGROUND OF THE INVENTION

The present invention relates generally to magnetic resonance (MR) imaging and, more particularly, to a method and apparatus that enables a user to interactively set parameters of an MR pulse sequence through inspection of frequency spectra derived from pre-scan data. In particular, the invention is directed to the acquisition of non-phase encoded data that is acquired in a readout window without a readout gradient.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The principles of MR have been exploited to develop numerous imaging protocols to capture contrast from static tissue as well as flowing blood. One commonly implemented imaging option that is used to improve image contrast is chemical saturation. With chemical saturation data is collected for an image from just one chemical shift component in a region-of-interest. This is achieved by suppressing the NMR signals from those hydrogen nuclei that correspond to the chemical shift component that is not to be imaged. For example, if the region-of-interest is primarily composed of water and fat, each having a different chemical shift, through application of the appropriate chemical saturation, data collected and the resulting image would be of either water or fat, but not both. As the nuclei of fat are normally suppressed, chemical suppression is generally referred to as fat suppression.

In conventional fat suppression, a frequency selective saturation pulse is applied before standard imaging pulses of the pulse sequence. The frequency selective saturation pulse suppresses the magnetization from fat. Accordingly, the reconstructed image consists mainly from water magnetization.

For fat and other chemical saturations to be effective, the frequency of the frequency selective saturation pulse must correspond to the resonant frequency of the component to be suppressed. While general guidance has been empirically developed for setting the frequency and amplitude of the saturation pulse, ultimately, the nuances of the MR scanner and the particulars of the object to be scanned generally necessitate a pre-scan to assist a user in determining the most appropriate parameters for the saturation pulse and other parameters of an impending scan. This fine tuning then allows the user to define the pulse sequence that will result in optimal fat signal suppression and optimal image quality.

In manual fine tuning of the preparatory (saturation) pulse (and imaging pulses), the user interactively sets the center frequency of the component to be imaged, typically water, the offset or chemical shifted frequency of the component to be suppressed, typically fat, and the amplitude of the RF pulse that will be applied to minimize signal emissions from the component to be suppressed. The interactive adjustment is made by generating a frequency spectrum from MR data acquired in a pre-scan which allows a user to visualize the signal from water and fat. It has been found that the amplitude for the saturation pulse that optimally minimizes fat signal is dependent upon the repetition time (TR) of the RF saturation pulse, the spin-lattice relaxation time ($T_1$) of fat, and the imaging pulses that also "flip" the component to be saturated. However, in conventional manual fine tuning of the saturation pulse amplitude and/or offset frequency, the RF pulse sequence used during the pre-scan has a TR that is typically unrelated to the effective TR of the saturation pulse for the clinical scan. In particular, the effective TR of the saturation pulse corresponds to the chosen clinical imaging TR divided by the number of slices excited during this TR interval. In circumstances where the TRs differ significantly, the amplitude of the saturation pulse that visually minimizes the fat signal in the pre-scan may not minimize the fat signal during the imaging scan. As a result, image quality is less than expected because saturation is less than expected, and may lead to repeated scans.

Similar drawbacks have been discovered in other pre-scan pulse sequences. That is, in some known pre-scans, pre-scan data is acquired under conditions that do not accurately reflect the conditions in which imaging or clinical data is acquired, leading to suboptimal determination/setting of the parameter(s) of interest. Moreover, for some systems and/or scans, interactive optimization is sometimes not performed or allowed at all which can result in repeated and time consuming scans.

It would therefore be desirable to have a system and method capable of enabling a user to interactively determine and set parameters for a imaging sequence with the aid of pre-scan data that is collected with a pre-scan pulse sequence such that the relative and/or absolute levels of MR signals in a frequency spectrum generated from the pre-scan data match those expected with an imaging scan. Such a system and method would enable a user to optimally define parameters for an impending scan conveniently, expeditiously, and efficiently.

BRIEF DESCRIPTION OF THE INVENTION

The present invention provides a system and method of acquiring MR data in a pre-scan and generating a frequency spectrum with the pre-scan data to enable a user to interactively determine parameters for an imaging scan that overcome the aforementioned drawbacks. The pre-scan data is acquired in a manner such that results in the relative levels of signals in the pre-scan frequency spectrum match those expected with the imaging scan.

In accordance with one aspect of the invention, the invention is embodied in a computer program stored on a computer readable storage medium and having instructions which, when executed by a computer, cause the computer to apply a pre-scan pulse sequence to acquire MR signals from a region-of-interest to be imaged with an imaging pulse sequence. The pre-scan pulse sequence is then interrupted to acquire pre-scan data without application of a readout gradient. The instructions further cause the computer to generate a frequency spectrum from the pre-scan data and display the frequency spectrum to interactively allow a user to establish scan parameters for the imaging pulse sequence.

In accordance with another aspect of the invention, an MR apparatus includes an MR system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MR apparatus also includes a computer programmed to apply a pre-scan pulse sequence over a series of TRs without phase encoding to establish steady-state saturation conditions in a region-of-interest. The computer is further programmed to readout MR signals from the region-of-interest without any "in plane" spatial encoding, and generate and display a frequency spectrum from the MR signals.

According to another aspect, the invention is embodied in a method for establishing a volume selective prescan. The method includes the steps of prescribing an imaging pulse sequence and playing out a pre-scan pulse sequence with pre-scan parameters determined from the prescribed imaging pulse sequence and without phase encoding (but still with frequency or "readout" encoding) in a region-of-interest. A frequency spectrum is generated from the MR signals and is displayed. In an alternate aspect, the MR signals are acquired with any desired in-plane encoding applied.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
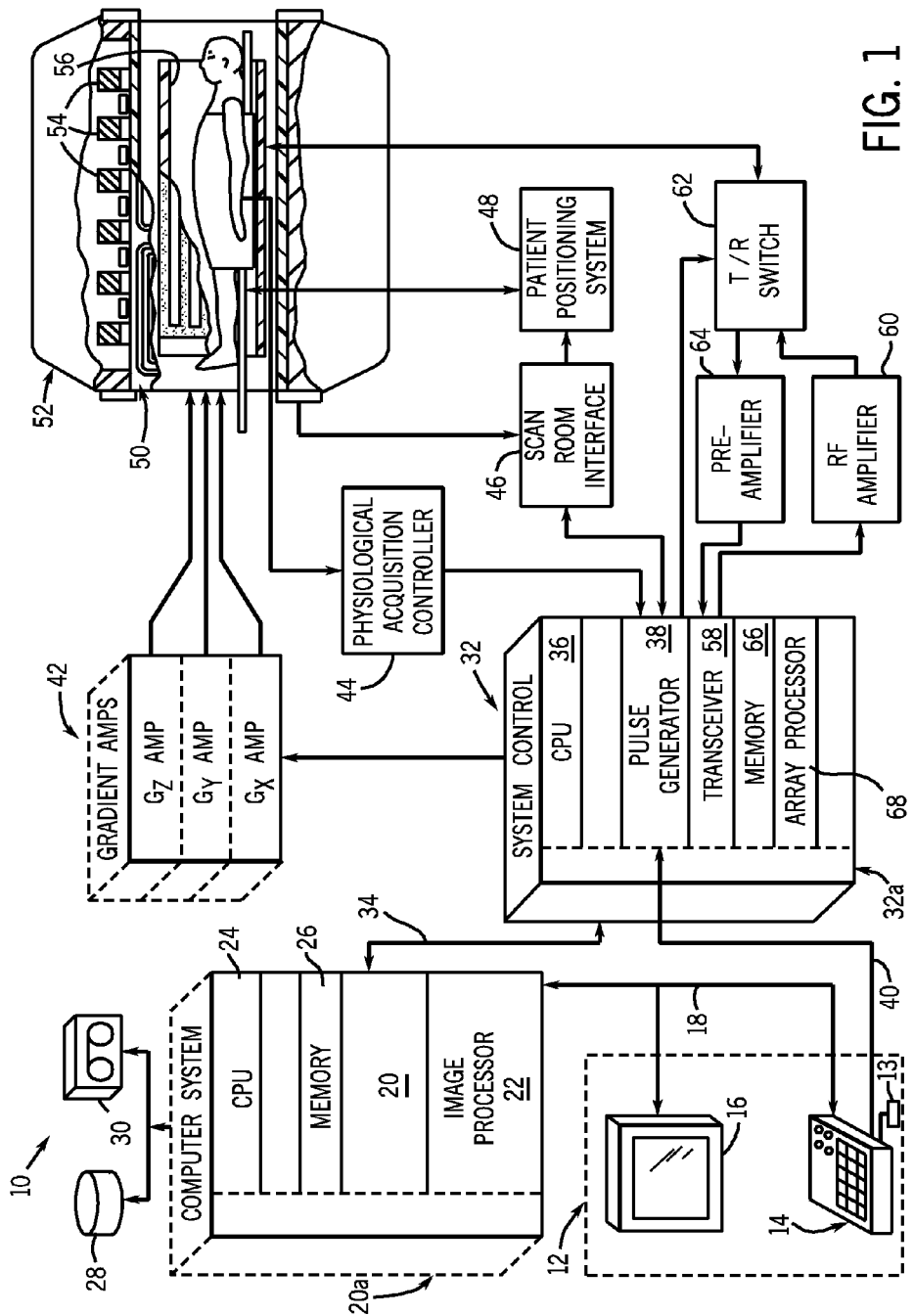
FIG. 1 is a schematic block diagram of an MR imaging system for use with the present invention.

Referring to FIG. 1, the major components of a preferred MR system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to a method and apparatus to enable a user to interactively and/or a system to automatically determine parameters for a scan. As will be described, this interactive adjustment is through visualization of a frequency spectrum. However, it is contemplated that adjustments can be made automatically without or in addition to user-visualization of a frequency spectrum. For purposes of explanation and not limitation, the invention will be described with respect to a user-interactive technique based on visualization of a frequency spectrum.

The invention executes a pre-scan to acquire MR data that is used to generate a frequency spectrum. The frequency spectrum is displayed to the user thereby allowing the user to visualize the relative signals from components, such as water and fat, in a region-of-interest, such as a given acquisition slice. In one preferred example, the frequency spectrum visually conveys the relative signal levels of fat (saturated component) and water (unsaturated component). It is contemplated, however, that the present invention is applicable with water suppression for fat imaging, silicon/silicone suppression for water or fat imaging, or fat and/or water suppression for silicon/silicone imaging.

Figure 2:
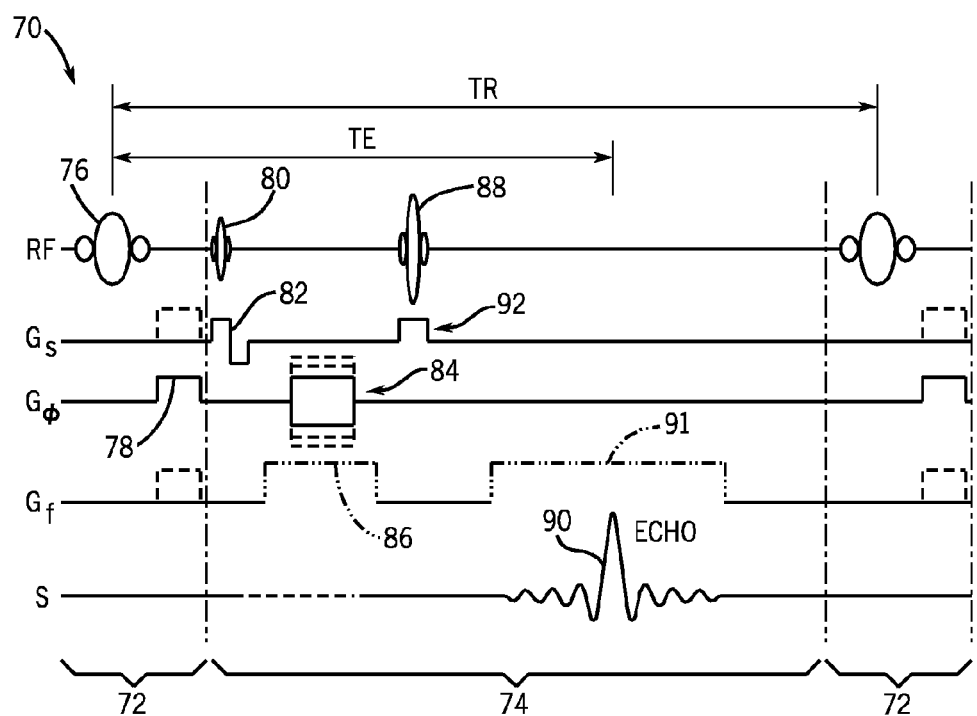
FIG. 2 is a schematic diagram of a pulse sequence for imaging with chemical saturation.

An exemplary imaging sequence for acquiring MR data with chemical saturation is shown in FIG. 2. The imaging sequence will be described with respect to fat saturation but a skilled artisan will appreciate that the pulse sequence may be equivalently used to saturate MR signals from other components in a region-of-interest. Also, the illustrated pulse sequence is particularly applicable for $T_1$-weighted imaging, but the invention is not so limited.

The pulse sequence 70 is segmented into a preparatory segment 72 and an imaging segment 74. The preparatory segment 72 includes an RF saturation pulse 76 that is frequency selective for the component, i.e., fat, that is to be suppressed in a region-of-interest, such as an imaging slice. The RF saturation pulse, as referenced here, is only chemically selective when there is no readout gradient. In other words, fat is suppressed both inside and outside the slice of interest (and all slices). The imaging segment of the sequence restricts the received signal (and resulting spectrum) to an imaging slice of interest. It is contemplated, however, that the present invention is also applicable with other preparatory segments, such as, for example, spatial-spectral RF pulses that provide simultaneous spatial (slice) and spectral (chemical or fat) saturation. Referring back to FIG. 2, RF saturation pulse 76 is applied to saturate or suppress MR signals from nuclei in and outside the "region-of-interest" that precess at a resonant frequency offset from the frequency at which nuclei that are to be imaged resonate. In this regard, the saturation pulse 76 has an "offset" frequency. The RF saturation pulse 76 is followed by a dephasing gradient 78 that forces the transverse magnetization of the shifted nuclei to zero. In the illustrated example, the dephasing gradient 78 is followed by a conventional spin echo pulse sequence in the imaging segment 74. Thus, the imaging segment 74 includes an RF excitation pulse 80, applied with a flip angle of 90 degrees, that is applied in the presence of a slice selective and slice rephasing gradients 82. Gradients 82 are followed by a zero-amplitude phase encoding gradient 84 and a frequency encoding gradient 91 and associated pre-dephaser pulse 86. For purposes of illustration, the zero-amplitude phase-encoding pulse 84 is shown in phantom to illustrate that, in the present invention, no phase encoding is used during acquisition of pre-scan data for frequency spectrum generation. During the acquisition of imaging data, however, phase encoded data is acquired. A 180 degree RF rephasing pulse 88 is then applied to cause rephasing of the magnetization in the un-suppressed nuclei whereupon an echo 90 is produced and is sampled for data collection under a frequency encoding gradient 91. The rephasing pulse 88 is played out in the presence of slice selective gradient 92. The readout gradient is also shown in phantom to represent that during acquisition of pre-scan data that is used for generating a frequency spectrum, as described herein, the readout gradient is not applied. In other words, as will be described, pre-scan data for frequency analysis is acquired in the absence of a frequency encoding or readout gradient.

To overcome the drawbacks of conventional pre-scan approaches, the present invention includes the acquisition of pre-scan data under steady-state saturation conditions with a low bandwidth acquisition window. This technique is described in greater detail with respect to FIG. 3.

Figure 3:
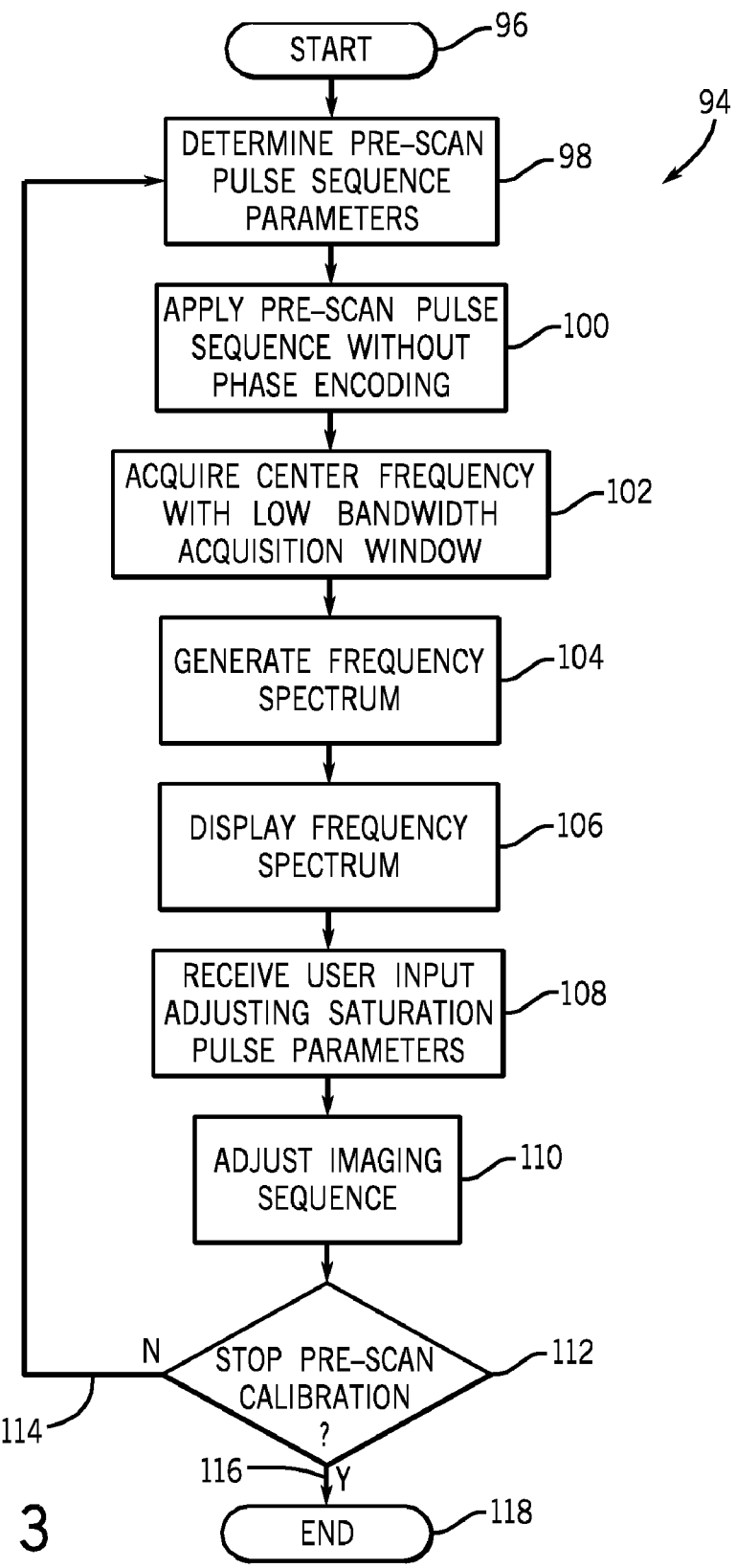
FIG. 3 is a flow chart setting forth the steps of interactively determining parameters for the pulse sequence illustrated in FIG. 2 in accordance with one aspect of the invention.

As shown in FIG. 3, the interactive technique 94 begins at 96 with user prescription of scan parameters for an impending scan. In the example of fat suppression, these initial scan parameters may include, but are not limited to, a center frequency, an offset frequency, and an amplitude of the RF saturation pulse that is applied to suppress signal from nuclei that precess at the offset frequency. Based on the initial parameters for the scan, parameters for a pre-scan pulse sequence are determined at 98. In accordance with the present invention, phase encoding gradients are not applied during application of the pre-scan pulse sequence. By applying the pulse sequence without phase encoding for several TRs, steady-state saturation conditions are achieved in the region-of-interest or target slice within the region-of-interest. In this regard, spatially localized signal from primarily one spectral component is acquired. The pre-scan pulse sequence is applied without phase encoding at 100 for several TRs, each TR interval contains all the preparatory and imaging segment pairs for each slice excited in the actual clinical scan sequence. Once steady-state saturation conditions are achieved, MR data for the center frequency is acquired at 102. In this regard, the pre-scan pulse sequence is interrupted and pre-scan data is collected with a low bandwidth acquisition window without the normal readout gradient 91, but still at the position of pulse 91 for the slice of interest. A typical pre-scan readout window is approximately 8 ms in duration and played out in the presence of a readout gradient, whereas the exemplary low bandwidth window is 250 ms in duration and is played out in the absence of a readout gradient. However, other acquisition windows of lower or higher bandwidth are contemplated. As a result of the acquisition of non-phase encoded data that is acquired without a readout gradient, the absolute and relative levels for saturated and unsaturated signals observed in a frequency spectrum generated from the acquired data at 104 and displayed at 106 match those expected for the imaging scan.

By acquiring the pre-scan data such that there is the aforementioned matching, user adjustments made to the amplitude of the RF saturation pulse, the center frequency, or offset frequency based on visual characterizations and impressions from the displayed spectrum will be pertinent. In this regard, the technique 94 continues at 108 with the reception of a user adjustment to the scan parameters to the imaging pulse sequence. For instance, a user input changing the amplitude of the RF saturation pulse of the imaging pulse sequence is received, but other user inputs may be received for adjusting other parameters of the imaging pulse sequence. Accordingly, the imaging pulse sequence parameters are adjusted at 110 based on the manual inputs from the user. It is contemplated that one or more scan parameters may be automatically adjusted based on automatic observations of the frequency spectrum of the pre-scan data as well as a result of adjustments to user-defined parameters.

The pre-scan acquisition loop is iterated until the user requests it to stop. With each iteration, it is contemplated that the parameters used to acquire the pre-scan data are changed based on one or more user inputs received after user visualization of the frequency spectrum or automatic changes that are made. If the user does not stop the calibration process 112, 114, the loop returns to step 98 with determination of the corresponding pre-scan parameters followed by execution of steps 100-110 heretofore described. Once calibration is terminated by a user input 112, 116, technique 94 ends at 118 with finalization of the imaging pulse sequence parameters and execution of the imaging pulse sequence in accordance with conventional imaging techniques. Thus, in a preferred embodiment, the pre-scan pulse sequence automatically reiterates with the user and/or automatic changes until the user has signaled that the pre-scan process is complete. It is also contemplated, however, that the pre-scan acquisition loop can be pre-set to run a certain number of times and therefore not require the user to "stop" the process. It is further contemplated that the frequency spectrum may be automatically analyzed with one of a number of frequency or signature analysis techniques and the pre-scan acquisition loop reiterated until the signature analysis indicates that optimal (or near-optimal) settings have been reached.

In a preferred embodiment, the pre-scan pulse sequence is reiteratively applied to acquire MR data such that multiple frequency spectra are acquired and displayed for a given slice and/or a given region-of-interest. In this regard, it is preferred that a time delay be observed between data acquisitions of center frequency data and spectrum display such that steady-state saturation conditions are reestablished in the region-of-interest or target slice. Steady-state saturation conditions are disrupted by the insertion of the readout window because the time it takes to acquire the low bandwidth acquisition of the MR signal evolving without a coincident readout gradient is more than the time it takes to acquire the "normal" high bandwidth acquisition of an MR echo under a "normal" imaging readout gradient. The extra time to play out the low bandwidth acquisition disrupts the periodicity of the sequence's RF pulses. Therefore, it is preferred that data for a next frequency spectrum is not collected until steady-state saturation conditions are reestablished in the region-of-interest or target slice. The pre-scan data may be 1D or 2D data.

As described above, it is contemplated that several TRs would be necessary for steady-state saturation conditions to be realized. Given that the $T_1$ and $T_2$ relaxation times of human tissues (such as fat) have known ranges, these known values and the clinical pulse sequence specifics (e.g., sequence types such as GRE/SE/FSE/EPI, preparatory sequence method, flip angles, TEs, TRs, number of slices, etc.) could be used to determine an approximate delay time to steady state fat signal amplitude. The delay could be determined empirically for different pulse sequences and stored in a look-up-table or a single delay could be used for all sequence cases. This delay is observed before any signal spectrum is displayed and/or before any scan parameter adjustments are made. It is also contemplated that an automated quantitative detection of fat signal stabilization could be used to enable fat saturation pulse amplitude and/or offset frequency adjustments.

Figure 4:
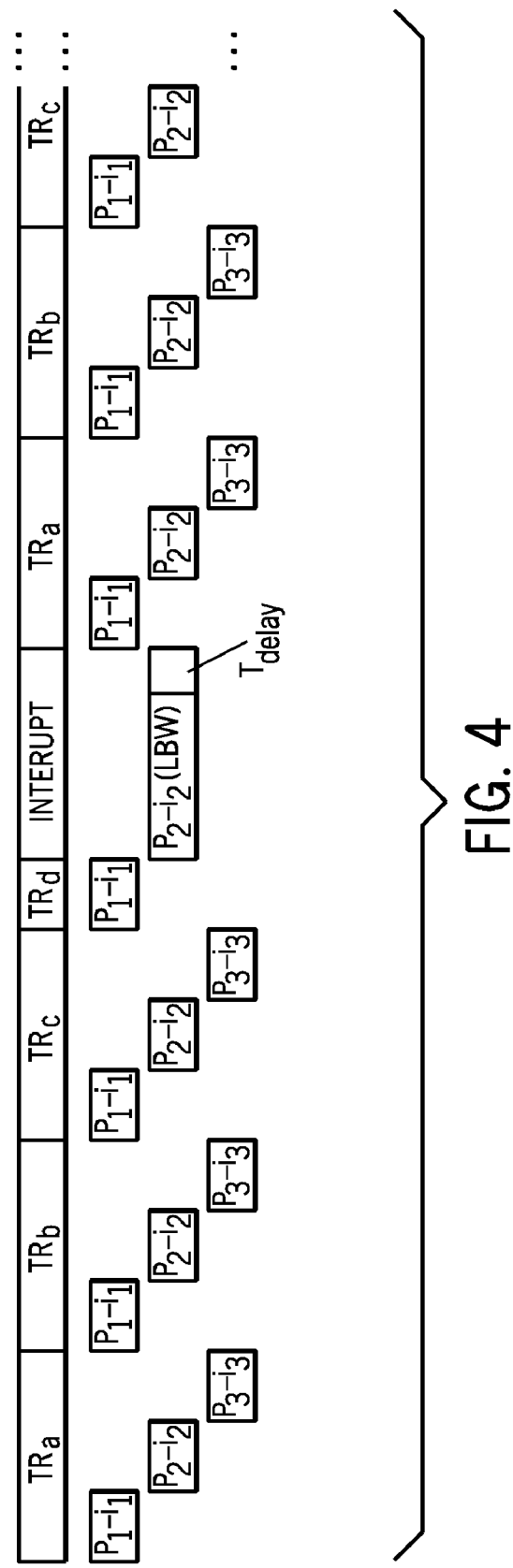
FIG. 4 is a timing diagram for acquiring non-phase-encoded data during steady-state saturation conditions in accordance with one aspect of the invention.

As described above, it is preferred to acquire pre-scan data from a slice of interest during steady-state saturation conditions. A timeline for such an acquisition is illustrated in FIG. 4. In the example of FIG. 4, three slices ($i_1$, $i_2$, $i_3$) are sampled. Each slice is prepped with a preparatory segment (e.g., $p_1$ is the prep segment for slice one). Thus, each slice is prepped and imaged. This is illustrated as $p_n$-$i_n$. In the example three "scan TR" intervals ($TR_a$, $TR_b$, $TR_c$) are needed to achieve steady state saturation. After $TR_c$, the preparatory and imaging segments for $TR_d$ begin to play out, but are interrupted early during the slice of interest (e.g., slice 2), by replacing its normal data acquisition window and readout gradient with a lower data acquisition window. At some time, $T_{delay}$, after the end of the low bandwidth acquisition window, the next pre-scan "loop" starts again. In this regard, the pre-scan sequence is played out as described above but with possibly different parameters reflecting adjustments made by the user or adjustments made automatically using predetermined or "real time" determined values/calculations. As described, the reiterative process continues until terminated by the user or automatically terminated by the system.

The heretofore described technique, which may be embodied in a computer program stored on a computer readable storage medium or in a computer data signal transmitted in a carrier wave, advantageously enables a user to correctly and optimally set the parameters of an imaging pulse sequence, (e.g., amplitude of a chemical saturation RF pulse), during manual pre-scan calibration of the imaging pulse sequence. Accordingly, the present invention, for example, allows a user to establish an amplitude for the saturation pulse that will minimize signal from saturated components during acquisition of imaging data. As a result, the present invention provides a marked improvement in image quality relative to conventional images acquired with chemical saturation. Additionally, a skilled artisan will appreciate that the present invention streamlines the pre-scan process thereby improving scan throughput.

The invention may also be extended to pulse sequence parameters other than saturation pulse amplitude, such as frequency and phase. Also, the invention is applicable with other saturation designs other than chemical saturation, such as inversion pulses and notch pulses for cardiac imaging, spatial-spectral saturation pulses, etc. In this regard, the invention creates a pre-scan acquisition process that acquires pre-scan data to optimize the preparatory segment of a pulse sequence. This optimization can be automatic, manual, or a combination thereof. In addition, it is contemplated that the pre-scan and/or frequency spectrum data can be stored for subsequent calculations or evaluation. In other words, it is contemplated that the frequency spectrum may or may not be generated and displayed in real-time.

Therefore, the invention includes a computer program stored on a computer readable storage medium and having instructions which, when executed by a computer, cause the computer to apply a pre-scan pulse sequence to acquire MR signals from a region-of-interest to be imaged with an imaging pulse sequence. The pre-scan pulse sequence is then interrupted to acquire pre-scan data without application of a readout gradient. The instructions further cause the computer to generate a frequency spectrum from the pre-scan data and display the frequency spectrum to interactively allow a user to establish scan parameters for the imaging pulse sequence.

The invention is also directed to an MR apparatus that includes an MR system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MR apparatus also includes a computer programmed to apply a pre-scan pulse sequence over a series of TRs without phase encoding to establish steady-state saturation conditions in a region-of-interest. The computer is further programmed to readout MR signals from the region-of-interest without spatial encoding, and generate and display a frequency spectrum from the MR signals.

The invention is further embodied in a method for establishing a volume selective prescan. The method includes the steps of prescribing an imaging pulse sequence and playing out a pre-scan pulse sequence with pre-scan parameters determined from the prescribed imaging pulse sequence and without phase encoding in a region-of-interest. A frequency spectrum is generated from the MR signals and is displayed.

The present invention has been described in terms of the preferred embodiment, and it is recognized that equivalents, alternatives, and modifications, aside from those expressly stated, are possible and within the scope of the appending claims.

What is claimed is:

1. A non-transitory computer readable storage medium having stored thereon a computer program comprising instructions which when executed by a computer cause the computer to:
   (A) apply a pre-scan pulse sequence to acquire MR signals from a region-of-interest to be imaged with an imaging pulse sequence;
   (B) interrupt the pre-scan pulse sequence; then
   (C) acquire pre-scan data from the region-of-interest without application of a readout gradient;
   (D) generate a frequency spectrum from the pre-scan data; and
   (E) display the frequency spectrum to interactively allow a user to establish scan parameters for the imaging pulse sequence.

2. The computer readable storage medium of claim 1 wherein the scan parameters include at least one center frequency of an imaging component within the region-of-interest, an offset frequency to saturate a given component within the region-of-interest and different from the imaging component, and an amplitude for a saturation pulse of the imaging pulse sequence.

3. The computer readable storage medium of claim 2 wherein the imaging component is one of water and fat and the given component is the other of fat and water.

4. The computer readable storage medium of claim 1 wherein the instructions further cause the computer to iteratively repeat (A) thru (E) until a user-desired imaging pulse sequence is established.

5. The computer readable storage medium of claim 1 wherein the instructions further cause the computer to acquire the pre-scan data during steady-state saturation conditions in the region-of-interest.

6. The computer readable storage medium of claim 5 wherein the instructions further cause the computer to acquire the pre-scan data by:
   applying the pre-scan pulse sequence without phase encoding for several TRs;
   interrupting the pre-scan pulse sequence after the several TRs; and then
   sampling the signal from a region-of-interest with a low bandwidth acquisition window, the low bandwidth acquisition window acquiring data absent a readout gradient.

7. The computer readable storage medium of claim 1 wherein the instructions further cause the computer to acquire the pre-scan data such that absolute and/or relative levels for fat and water MR signals acquired from the region-of-interest approximate or match those expected/desired during application of the imaging pulse sequence.

8. The computer readable storage medium of claim 1 wherein the instructions further cause the computer to play out a number of TRs after acquisition of the pre-scan data sufficient to return the region-of-interest to steady-state saturation conditions before re-acquiring pre-scan data from the region-of-interest.

9. The computer readable storage medium of claim 1 wherein the instructions further cause the computer to receive a series of user-inputs setting forth the scan parameters for the imaging pulse sequence based on observations of the user from viewing one or more frequency spectrum acquired during steady-state saturation conditions with the pre-scan pulse sequence, the scan parameters including at least one of center frequency, offset frequency, pulse amplitude, pulse duration, number of inversion pulses, pulse width, pulse area, pulse phase, plane oblique angle, slice offset, FOV size or offset, and time delay between application of an inversion pulse and a next excitation pulse.

10. The computer readable storage medium of claim 9 wherein the instructions further cause the computer to automatically adjust other scan parameters for the imaging pulse sequence based on changes to user-defined scan parameters made with the user-inputs.

11. An MR apparatus comprising:
    an MR system having a plurality of gradient coils positioned about a bore of a magnet to impress a polarizing magnetic field and an RF transceiver system and an RF switch controlled by a pulse module to transmit RF signals to an RF coil assembly to acquire MR images; and
    a computer readable storage medium having stored thereon a computer program comprising instructions which when executed by a computer cause the computer to:
    apply a pre-scan pulse sequence over a series of TRs;
    readout MR signals from a region-of-interest without spatial encoding of the MR signals; and
    generate and display a frequency spectrum from the MR signals.

12. MR apparatus of claim 11 wherein the computer is further programmed to apply the pre-scan pulse sequence without phase encoding to establish steady-state saturation conditions in a region-of-interest.

13. The MR apparatus of claim 11 wherein the computer is further programmed to construct an imaging pulse sequence from one or more user-inputs based on user-observations of the frequency spectrum.

14. The MR apparatus of claim 11 wherein signal levels in the frequency spectrum are substantially similar to those expected with the imaging pulse sequence.

15. The MR apparatus of claim 11 wherein the computer is further caused to repeatedly apply the pre-scan pulse sequence but observe a delay between readouts, the delay of sufficient length to allow for reestablishment of steady-state saturation conditions in the region-of-interest.

16. The MR apparatus of claim 11 wherein the frequency spectrum is displayed to enable a user to determine at least one of a desired center frequency, a desired offset frequency, and a desired amplitude for a saturation pulse of the imaging pulse sequence, the saturation pulse designed to saturate spins in the region-of-interest having a resonant frequency substantially similar to the offset frequency.

17. The MR apparatus of claim 16 wherein the center frequency corresponds to a resonant frequency of water and the offset frequency corresponds to a resonant frequency of fat.

18. The MR apparatus of claim 11 wherein the computer is further caused to receive a series of user-inputs setting forth scan parameters for the imaging pulse sequence based on observations of the user from the displayed frequency spectrum.

19. The MR apparatus of claim 11 wherein the computer is further caused to readout the MR signals in the absence of a readout gradient.

20. A method of establishing parameters for an imaging sequence, the method comprising:
- prescribing an imaging pulse sequence with a first acquisition window;
- playing out a pre-scan pulse sequence with pre-scan parameters determined from the prescribed imaging pulse sequence;
- interrupting the pre-scan pulse sequence;
- acquiring MR signals with the pre-scan pulse sequence from the region-of-interest during a period of interruption and in a second acquisition window different in bandwidth than that of the first acquisition window;
- generating a frequency spectrum from the acquired MR signals; and
- displaying the frequency spectrum.

21. The method of claim 20 further comprising the step of playing out the pre-scan pulse sequence without phase encoding.

22. The method of claim 20 further comprising the step of generating the frequency spectrum from MR signals only acquired during steady-state saturation conditions.

23. The method of claim 20 wherein the imaging pulse sequence has a suppression pulse and further comprising the step of receiving a user input defining an amplitude for the suppression pulse based on user-observation of the frequency spectrum.

24. The method of claim 20 further comprising the step of acquiring the MR signals without application of a readout gradient.

25. The method of claim 20 further comprising the step of receiving a first user input identifying a resonant frequency of a component to be imaged and a second user input identifying a resonant frequency of a component to be suppressed, and applying the pre-scan pulse sequence with an RF excitation pulse at a frequency matched to the resonant frequency of the component to be imaged and with a RF suppression pulse at a frequency matched to the resonant frequency of the component to be suppressed.

26. The method of claim 20 wherein the signal levels correspond to those of water and fat in the region-of-interest.

27. The method of claim 20 further comprising the step of limiting data acquisition from a slice defined within the region-of-interest.

28. The method of claim 20 further comprising the step of storing at least one of the acquired MR signals and the generated frequency spectrum.

29. The method of claim 28 further comprising the steps of automatically determining scan parameters for the imaging pulse sequence from that stored in the step of storing.

30. The method of claim 20 wherein the frequency spectrum is displayed in near-real-time.

31. The method of claim 20 wherein the imaging pulse sequence is constructed for one of:
- water imaging with fat and/or silicon/silicone suppression;
- fat imaging with water and/or silicon/silicone suppression;
- silicon/silicone imaging with fat and/or water suppression;
- contrast enhanced imaging with selective saturation;
- spectral/spatial pulses parameters adjustment; and
- center frequency adjustment for true FISP imaging.

* * * * *